US007570218B2

(12) United States Patent
Tsujimura et al.

(10) Patent No.: US 7,570,218 B2
(45) Date of Patent: Aug. 4, 2009

(54) MOBILE COMMUNICATION TERMINAL

(75) Inventors: Akihiro Tsujimura, Ome (JP); Hiroyuki Hotta, Ome (JP); Takashi Amano, Soka (JP); Koichi Sato, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 472 days.

(21) Appl. No.: 11/496,822

(22) Filed: Aug. 1, 2006

(65) Prior Publication Data

US 2007/0241971 A1 Oct. 18, 2007

(30) Foreign Application Priority Data

Apr. 13, 2006 (JP) ............... 2006-111296

(51) Int. Cl.
*H01Q 1/24* (2006.01)
*H01Q 1/38* (2006.01)
*H01Q 1/00* (2006.01)

(52) U.S. Cl. ................ 343/702; 343/700 MS; 343/787

(58) Field of Classification Search .......... 343/700 MS, 343/702, 787, 872
See application file for complete search history.

(56) References Cited

U.S. PATENT DOCUMENTS 5,926,139 A * 7/1999 Korisch ....................... 343/702
6,031,731 A 2/2000 Suesada et al.
6,861,986 B2 * 3/2005 Fang et al. ............ 343/700 MS
2008/0303735 A1* 12/2008 Fujimoto et al. ............ 343/787

FOREIGN PATENT DOCUMENTS

| JP | 57-062635 A | 4/1982 |
|----|----|----|
| JP | 03-149904 A | 6/1991 |
| JP | 05-199131 A | 8/1993 |
| JP | 07-273685 A | 10/1995 |
| JP | 09-093029 A | 4/1997 |
| JP | 11-031909 A | 2/1999 |
| JP | 11-046108 A | 2/1999 |
| JP | 2002-158486 A | 5/2002 |
| JP | 2003-134200 A | 5/2003 |
| JP | 2003-297629 A | 10/2003 |
| JP | 2003-347123 A | 12/2003 |
| JP | 2004-274730 A | 9/2004 |
| JP | 2006-013976 A | 1/2006 |
| JP | 2006-086412 A | 3/2006 |
| JP | 2007-251441 A | 9/2007 |

OTHER PUBLICATIONS

Japanese Office Action (and English translations thereof) dated Mar. 18, 2008, issued in a counterpart Japanese Application.

* cited by examiner

*Primary Examiner*—Shih-Chao Chen
(74) *Attorney, Agent, or Firm*—Frishauf, Holtz, Goodman & Chick, P.C.

(57) ABSTRACT

An antenna element made of an electrically conductive material pattern is printed and formed on a face of a casing made of an electrically nonconductive material having a circuit board housed therein, and the antenna element and the circuit board are electrically connected to each other by a connecting element.

15 Claims, 12 Drawing Sheets

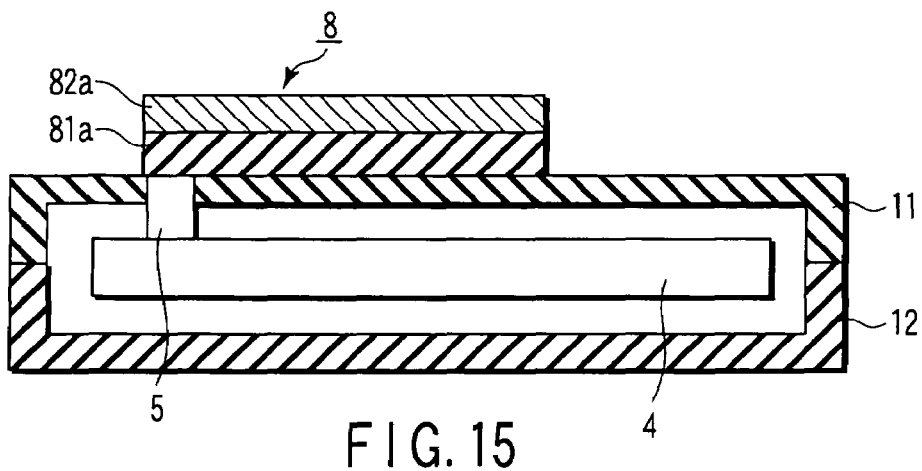
F I G. 15
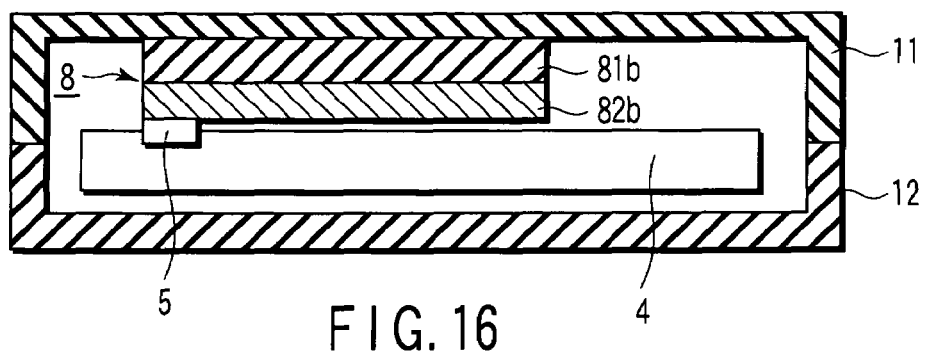
F I G. 16
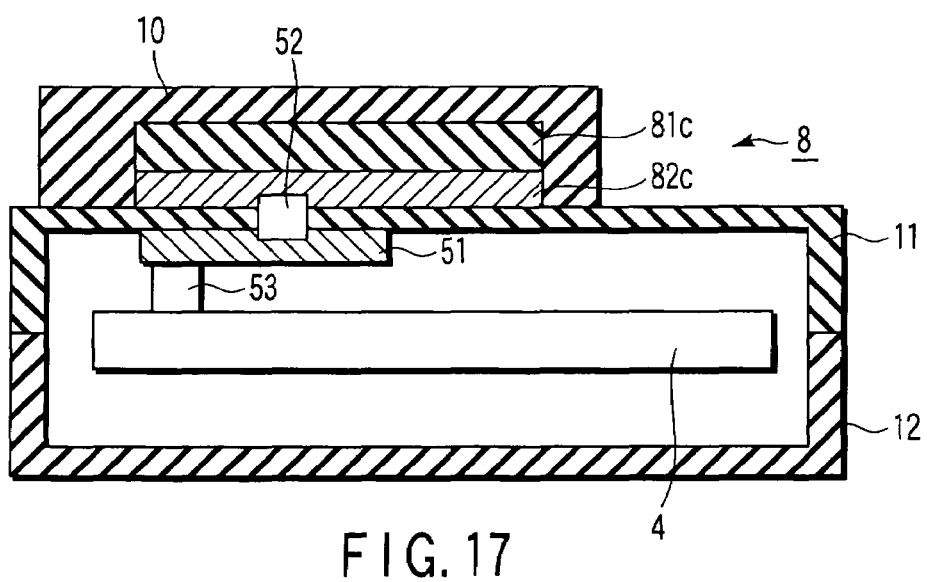
F I G. 17

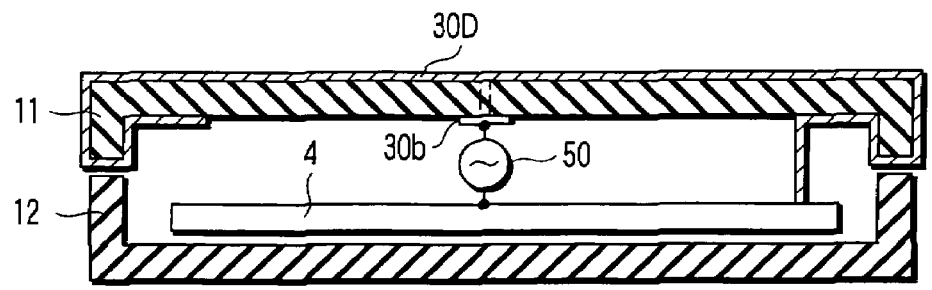
F I G. 32
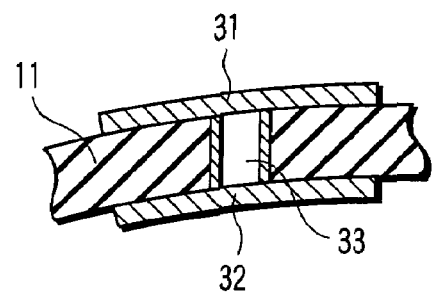
F I G. 33
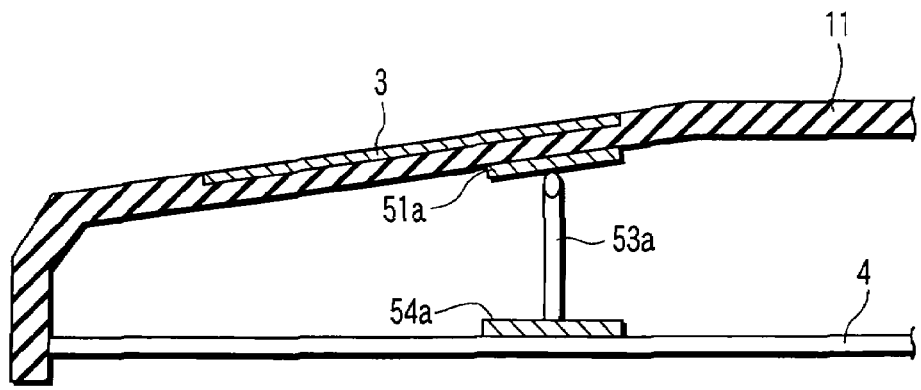
F I G. 34

MOBILE COMMUNICATION TERMINAL

CROSS-REFERENCE TO RELATED APPLICATIONS

This application is based upon and claims the benefit of priority from prior Japanese Patent Application No. 2006-111296, filed Apr. 13, 2006, the entire contents of which are incorporated herein by reference.

BACKGROUND OF THE INVENTION

1. Field of the Invention

The present invention relates to a mobile communication terminal such as a cellular phone, a personal digital assistant (PDA) or a personal computer (PC) and more particularly, to a mobile communication terminal that includes a built-in antenna.

2. Description of the Related Art

Recently, in a mobile communication terminal represented by a cellular phone, a PDA, or a PC, there has been added a variety of diversified functions such as a web access function or a remote control function relevant to a peripheral device, a function serving as a season ticket, and an electronic money settlement function as well as a telephone communication function or an electronic mail transmitting and receiving function. With respect to only a communication interface, in addition to a communication interface for mobile communication using a G (giga) Hz band, there has been introduced a terminal that includes plural types of communication interfaces in order to use Bluetooth (registered trademark), a wireless local area network (LAN) or the like. For this reason, there is a tendency that a mobile communication terminal becomes increasingly large in size. On the other hand, there is a user's demand for further reduction in size and weight in order to improve portability.

Therefore, a variety of downsizing techniques have been proposed. As one of such techniques, an antenna downsizing technique is exemplified. For example, there has been proposed a technique in which part of a casing is composed of an electrically conductive material, and a conductor section of this casing is connected to a radio communication circuit, thereby operating as part of an antenna (refer to, for example, Jpn. Pat. Appln. KOKAI Publication No. 2004-274730).

However, in the foregoing conventional technique, there is not disclosed in detail a technique for providing part of the casing made of an electrically conductive material or a technique for connecting a conductor section of the casing and a radio communication circuit to each other, making it difficult to carry out the invention. Therefore, there has been a keen desire for establishment of an antenna downsizing technique that can be carried out.

BRIEF SUMMARY OF THE INVENTION

The present invention has been made in view of the above-described circumstance. It is an object of the present invention to provide a mobile communication terminal that easily and inexpensively achieves integration between a casing and an antenna and enables further downsizing and improvement of a degree of freedom in shape of a terminal casing.

According to a first aspect of the present invention, an antenna element made of an electrically conductive material pattern is printed and formed on a face of a casing made of an electrically nonconductive material having a circuit board housed therein and the antenna element and the circuit board are configured so as to be electrically connected to each other by a connecting portion.

Therefore, the antenna element is formed by printing an conductive material pattern on a casing face, and thus, can be configured easily and inexpensively. Moreover, the antenna element can be formed on a curved face of the casing, thus making it possible to improve the degree of freedom in shape of the casing.

Namely, in the case where an antenna device is additionally fabricated, and is mounted on the casing, there is a need for fabricating a dedicated mold, thus resulting in higher fabrication cost. There is also a need for the step of mounting the antenna device on the casing, thus requiring a large amount of time and inconvenience in assembling a terminal. Further, in order to house the antenna device in the casing, a limitation naturally occurs in shape of the casing, and the degree of freedom in shape of the casing is lowered.

According to a second aspect of the present invention, an antenna unit is prepared such that antenna element made of an electrically conductive material pattern is printed and formed on an antenna substrate face made of an electrically nonconductive material, and the antenna unit is installed on a face of the casing made of an electrically nonconductive material, the casing having a circuit board housed therein. Then, the antenna element of the antenna unit and the circuit board are electrically connected to each other by a connecting portion.

Therefore, an antenna element is formed by printing a conductive material pattern on an antenna substrate, and thus, can be configured easily and inexpensively without additionally fabricating a mold or the like. Moreover, for example, the antenna substrate is molded in advance in accordance with the shape of the casing or is made of a member having flexibility, thereby making it possible to install the antenna unit on a curved face of the casing or the like. Consequently, the degree of freedom in shape of the casing can be improved.

Further, the antenna element is formed on the antenna substrate without being directly formed on a face of the casing. As a consequence, a material having heat resistance or acid resistance is used as an antenna substrate, thereby making it possible to carry out arbitrary surface processing such as plating processing with respect to the antenna element. In addition, there is no need for using a material having heat resistance or acid resistance as a material for the casing, thus making it possible to achieve cost reduction as well as to improve the degree of freedom in choosing a material for the casing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 15 is a sectional view taken along the line B-B of the cellular phone shown in FIG. 1 and is a view showing Example 1 of an allocation structure of an antenna element;

FIG. 16 is a view showing Example 2 of an allocation structure of an antenna element of the cellular phone shown in FIG. 14;

FIG. 17 is a view showing Example 3 of an allocation structure of an antenna element of the cellular phone shown in FIG. 14;

FIG. 32 is a sectional view showing a configuration of essential portions of a cellular phone according to a sixth embodiment of the present invention;

FIG. 33 is a partial cross section showing a configuration of essential portions of a cellular phone according to another Example of the present invention;

FIG. 34 is a view showing a further improved example of an installation structure of the antenna element shown in FIG. 12;

DETAILED DESCRIPTION OF THE INVENTION

First Embodiment

Example 1

Figure 1:
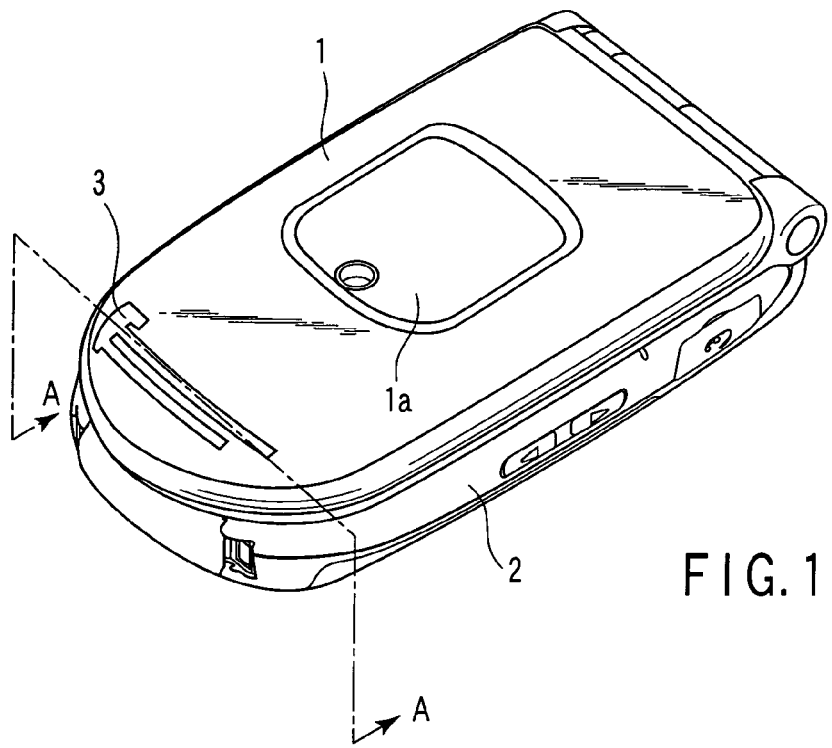
FIG. 1 is a perspective view showing a configuration of a cellular phone according to a first embodiment of the present invention.
Figure 2:
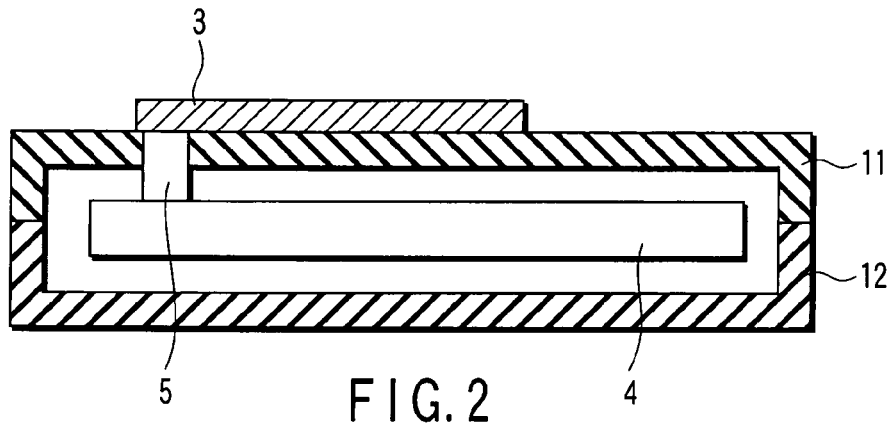
FIG. 2 is a sectional view taken along the line A-A of the cellular phone shown in FIG. 1 and is a view showing Example 1 of an allocation structure of an antenna element.

FIG. 1 is a perspective view showing a configuration of Example 1 of a cellular phone according to a first embodiment of the present invention. FIG. 2 is a sectional view taken along the line A-A of the cellular phone shown in FIG. 1 and is a view showing Example 1 of an allocation structure of an antenna element.

The cellular phone connects an upper casing 1 made of an electrically nonconductive material with a lower casing 2 via a hinge mechanism. The upper casing 1 is composed of an outer cover 11 having a sub-display allocated thereon, and an inner cover 12 having a main display (not shown) allocated thereon.

At a distal end of a surface of the outer cover 11, an antenna element 3 made of an electrically conductive material pattern having a thickness of about 10 μm is formed by means of printing and plating. Pad printing, screen printing, offset printing or the like is used as a printing method. For example, gold, silver, or copper is used for electrically conductive pasting for forming the antenna element 3. At this time, a curing temperature is lowered and good electrical conductivity can be obtained by using nano-pasting. In the case where the antenna element 3 is made of copper, nickel and gold may be plated after laminated on the copper. By doing this, electrical conductivity of the antenna element 3 can be improved. Further, a catalyst is printed on the outer cover 11, and a plating layer is formed so as to print and form the antenna element 3 on the plating layer.

On the other hand, a printed circuit board 4 is housed in the upper casing 1. A printed wiring pattern and a grounding pattern are formed on the printed circuit board 4, and further, an electronic device configuring a radio frequency power supply circuit is mounted. Further, a hole portion is punched on a site at which the antenna element 3 of the outer cover 11 is to be formed. Via the hole portion, the antenna element 3 and a radio power supply circuit of the printed circuit board 4 are electrically connected to each other via a connecting portion 5.

As has been described above, in this cellular phone, the antenna element 3 is formed by printing an electrically conductive material pattern on a surface of the outer cover 11. For this reason, there is no need for fabricating a dedicated mold for fabricating an antenna, thereby making it possible to ensure that the fabrication cost is reasonable. In addition, since the step of mounting an antenna is reduced, there is an advantage that assembling of a cellular phone can be simplified.

Moreover, the antenna element 3 can be formed on a curved face of the casing 1 by using printing. For this reason, the degree of freedom in shape of the casing 1 is improved to make it possible to improve the design property. Further, the antenna element 3 is formed on a surface of the outer cover 11 of the upper casing 1. Thus, a distance between the antenna element 3 and the printed circuit board 4 housed in the upper casing 1 can be spaced to be equal to or greater than at least the thickness of the outer cover 11. As a result, antenna characteristics can be improved, and moreover, the casing can be reduced in thickness as compared with installing the antenna element 3 in the casing 1.

Example 2

Figure 3:
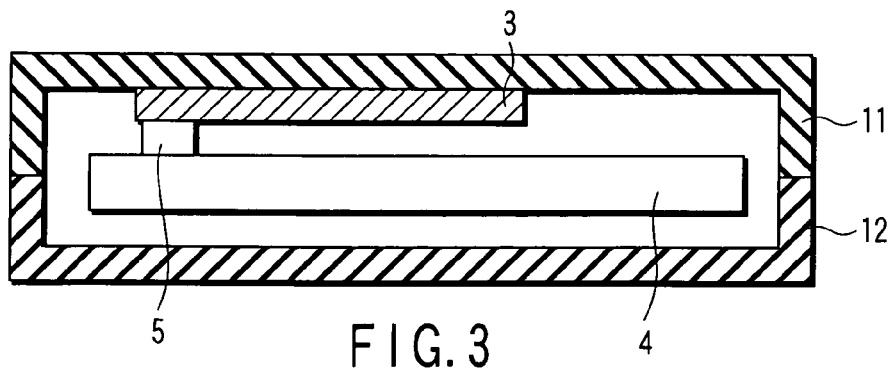
FIG. 3 is a view showing Example 2 of an allocation structure of the antenna element in the cellular phone shown in FIG. 1.

In Example 2, as shown in FIG. 3, an antenna element 3 is directly printed and formed on a back face of an outer cover 11 of an upper casing 1, and the antenna element 3 and a radio power supply circuit of a printed circuit board 4 are connected to each other by a connecting portion 5. With such a configuration, irregularities on the surface of the outer cover 11 due to the antenna element 3 are eliminated, so that the surface of the outer cover 11 can be formed flat, thereby making it possible to improve the design property.

Example 3

Figure 4:
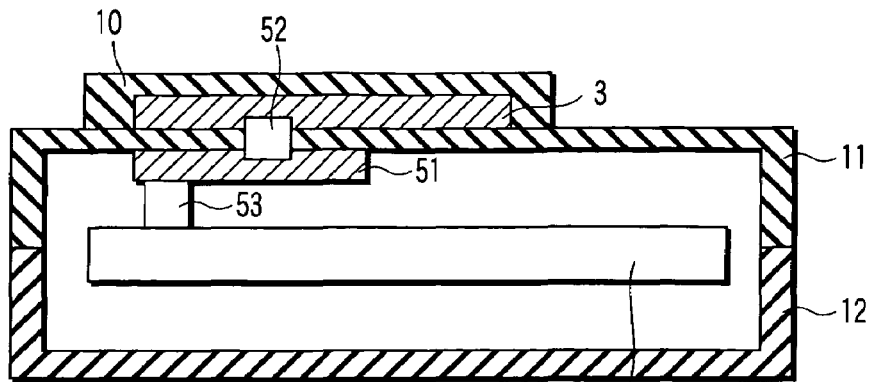
FIG. 4 is a view showing Example 3 of an allocation structure of the antenna element in the cellular phone shown in FIG. 1.

In Example 3, as shown in FIG. 4, an antenna element 3 is formed on a surface of an outer cover 11 and an electrically conductive material pattern 51 is printed and formed on a back face of the outer cover 11. Then, a hole portion is provided on the cover 11. Via the hole portion, the antenna element 3 and the electrically conductive material pattern 51 are connected to each other by a first connecting element 52. In addition, the electrically conductive wiring pattern 51 and a radio power supply circuit of a printed circuit board 4 are connected to each other by a second connecting element 53. A resin coat member 10 is formed on the antenna element 3. The coat member 10 may be made of polyimide or the like.

With such a configuration, the antenna element 3 and the electrically conductive material pattern 51 can be connected to each other and an electrically conductive material pattern 52 and a radio power supply circuit of the printed circuit board 4 are connected to each other, independently. Consequently, a cellular phone can be easily assembled. Furthermore, the antenna element 3 is protected by the coat member 10, thereby making it possible to improve reliability.

Example 4

Figure 5:
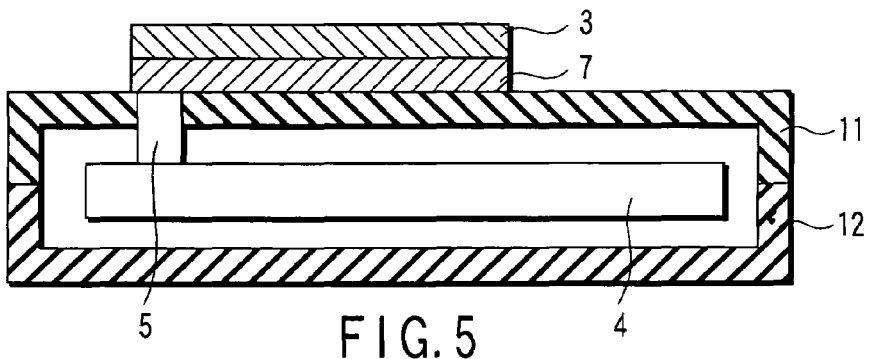
FIG. 5 is a view showing Example 4 of an allocation structure of the antenna element in the cellular phone shown in FIG. 1.

In Example 4, as shown in FIG. 5, a magnetic member 7 having high permeability is formed on a surface of an outer cover 11, and an antenna element 3 is formed on the magnetic member 7 by means of printing, spraying or a planar shape. Then, a hole portion is provided on the magnetic member 7 and outer cover 11. Via the hole portion, the antenna element 3 and a printed circuit board 4 are connected to each other by a connecting element 5.

The magnetic member 7 has a nano-granular structure in which magnetic nano-particles are allocated to be dispersed on an insulating matrix substrate in a three-dimensional structure, and is molded in a planar shape. For example, a rubber, an insulating resin, or an insulating ceramics is used as an insulating matrix substrate. As magnetic nano-particles, metal particles having a magnetic property are used. A magnetic property denotes a property that, even if no external magnetic field is present, magnetic moments are regularly arranged, and magnetization occurs. Examples of metal particles having this property include Co, Fe, and Ni. The magnetic member 7 having such a structure has a feature that the permeability $\mu$ is high, a low loss is provided, and moreover, a film can be easily thickened. It is preferable that the step of directly printing the antenna element 3 on the magnetic member 7 be carried out in an atmosphere filled with an inert gas such as nitrogen or argon.

With such a configuration, radiation characteristics are improved, and at the same time, radiation characteristics can be improved due to an advantageous effect of restricting generation of an image current on metal faces of the antenna element 3 and the printed circuit board 4 by means of the magnetic member 7. Further, there is no need for setting a large gap between the antenna element 3 and the printed circuit board 4 in order to maintain high impedance, thereby making it possible to downsize (reduce in thickness) the antenna device.

Example 5

Figure 6:
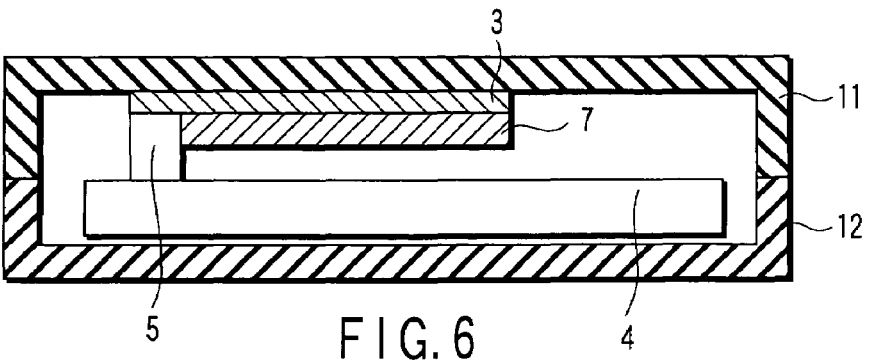
FIG. 6 is a view showing Example 5 of an allocation structure of the antenna element in the cellular phone shown in FIG. 1.

In Example 5, as shown in FIG. 6, an antenna element 3 is first formed on a back face of an outer cover 11 by means of printing, spraying or a planar shape, a magnetic member 7 having high permeability is formed on a surface of this antenna element 3. Then, a cutout portion is provided at an end of the magnetic member 7. Through the cutout portion, the antenna element 3 and printed circuit board 4 are connected to each other by a connecting element 5. The magnetic member 7, as described in Example 3 above, is made of a material having a nano-granular structure in which magnetic nano-particles are allocated to be dispersed on an insulating matrix substrate in a three-dimensional structure, and the material is molded in a planar shape.

With such a configuration, as in Example 3 above, radiation characteristics are improved, and at the same time, radiation characteristics can be improved due to an advantageous effect of restricting generation of an image current on metal faces of the antenna element 3 and the printed circuit board 4 by means of the magnetic member 7.

Example 6

Figure 7:
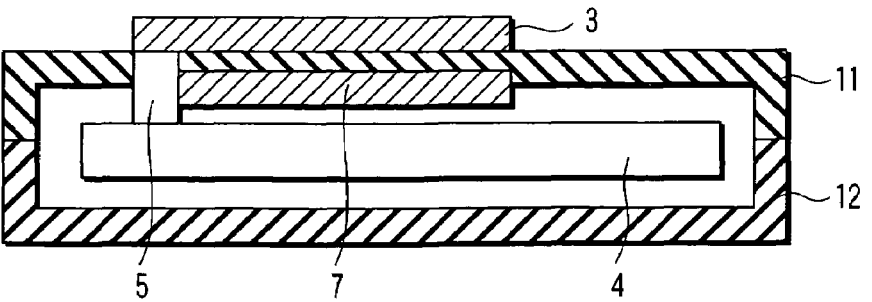
FIG. 7 is a view showing Example 6 of an allocation structure of the antenna element in the cellular phone shown in FIG. 1.

In Example 6, as shown in FIG. 7, an antenna element 3 is formed on a surface of an outer cover 11 by means of printing and a magnetic member 7 having high permeability is formed at a corresponding position while the antenna element 3 and outer cover 11 on a back face of the outer cover 11 are sandwiched. Then, a position of a hole is punched on the other outer cover 11, a cutout portion is provided at an end of the magnetic member 7, so that the antenna element 3 and printed circuit board 4 are connected to each other by a connecting element 5 through the position of a hole and cutout portion. The magnetic member 7, as in Example 3 above, is made of a material having a nano-granular structure in which magnetic nano-particles are allocated to be dispersed on an insulating matrix substrate in a three-dimensional structure, and the material is molded in a planer shape.

With such a configuration, as in Example 3 above, radiation characteristics are improved, and at the same time, radiation characteristics can be improved due to an advantageous effect of restricting generation of an image current on metal faces of the antenna element 3 and the printed circuit board 4 by means of the magnetic member 7.

On the other hand, the following embodiments are considered as a specific configuration of a first connection element 52 and a second connection element 53 shown in FIG. 4 described above.

Figure 8:
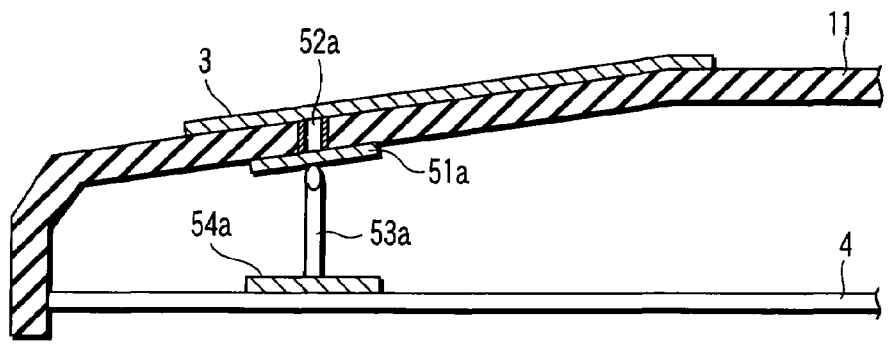
FIG. 8 is a view showing Example 1 of a structure of connection between an antenna element and a circuit board in the cellular phone shown in FIG. 1.

That is, in Example 1, as shown in FIG. 8, a through-hole 52*a* is provided on an outer cover 11 and a radio power supply pad 51*a* is formed as an electrically conductive material pattern 51. The radio power supply pad 51*a* and the antenna element 3 are connected to each other by the through-hole 52*a*. In addition, a spring connector 53*a* is embedded on a pattern 54*a* of a printed circuit board 4, and a distal end of the spring connector 53*a* is pushed into contact with the radio power supply pad 51*a*, whereby the radio power supply pad 51*a* and a radio power supply circuit of the printed circuit board 4 are electrically connected to each other.

With such a configuration, by using the spring connector 53*a* as a second connector 53, electrical connection between the radio power supply pad 51*a* and the radio power supply circuit of the printed circuit board 4 can be reliably achieved without a large installation space.

Figure 9:
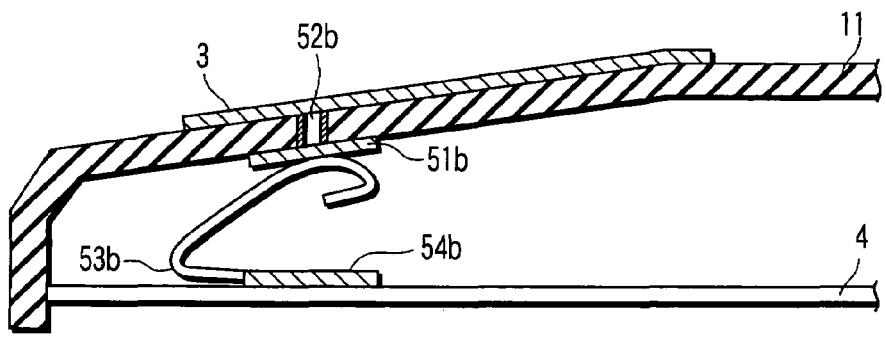
FIG. 9 is a view showing Example 2 of a structure of connection between an antenna element and a circuit board in the cellular phone shown in FIG. 1.

In Example 2, as shown in FIG. 9, a through-hole 52*b* is provided on an outer cover 11 and a radio power supply pad 51*b* is formed as an electrically conductive material pattern 51. The radio power supply pad 51*b* and the antenna element 3 are connected to each other by the through-hole 52*b*. Further, a proximal end of a metal plate spring 53*b* is fixed onto a wiring pattern 54*b* of the printed circuit board 4, and a distal end of the plate spring 53*b* is pushed into contact with the radio power supply pad 51*b*, whereby the radio power supply pad 51*b* and a radio power supply circuit of the printed circuit board 4 are electrically connected to each other.

While such a configuration requires an installation space for the plate spring 53*b*, an inexpensive connection structure having high reliability can be achieved.

Figure 10:
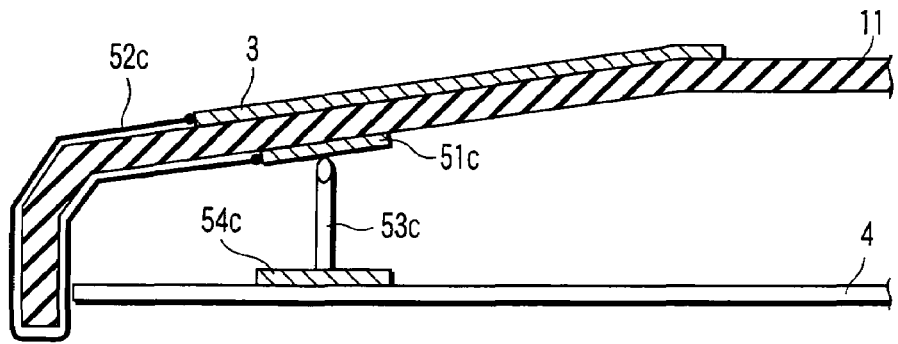
FIG. 10 is a view showing Example 3 of a structure of connection between an antenna element and a circuit board in the cellular phone shown in FIG. 1.

In Example 3, as shown in FIG. 10, an antenna element 3 formed on a surface of an outer cover 11 and a radio power supply pad 51*c* formed on a back face of the outer cover 11 are connected to each other by a conductive material pattern 52*c*. The conductive material pattern 52*c* is led in from the surface side of the outer cover 11 to the back face side thereof via an end rim of the cover 11. In addition, a spring connector 53*c* is embedded on a conductive material pad 54*c* of the printed circuit board 4, and a distal end of the spring connector 53*c* is pushed into contact with the radio power supply pad 51*c*, so that the radio power supply pad 51*c* and a radio power supply circuit of the printed circuit board 4 are electrically connected to each other.

With such a configuration, there is no need for punching a hole on the outer cover 11, whereby a structure of the outer cover 11 can be simplified.

Figure 11:
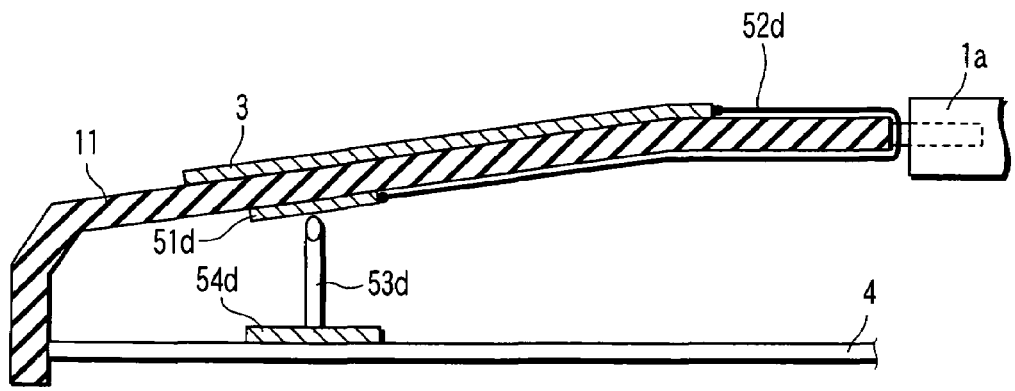
FIG. 11 is a view showing Example 4 of a structure of connection between an antenna element and a circuit board in the cellular phone shown in FIG. 1.

In Example 4, as shown in FIG. 11, when an antenna element 3 and a radio power supply pad 51*d* are connected to each other by a conductive material pattern 52*d*, the conductive material pattern 52*d* is led from the surface side to the back face side of an outer cover 11 via an end rim at which a sub-display 1*a* of the outer cover 11 is to be provided.

With such a configuration, the conductive material pattern 52*d* can be led at a position at which an external contact is less on the outer cover 11, whereby reliability relevant to cable disconnection or the like can be highly maintained.

Figure 12:
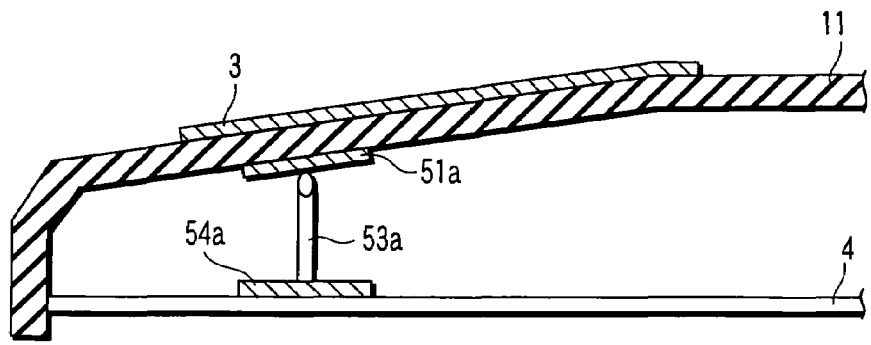
FIG. 12 is a view showing Example 5 of a structure of connection between an antenna element and a circuit board in the cellular phone shown in FIG. 1.
Figure 13:
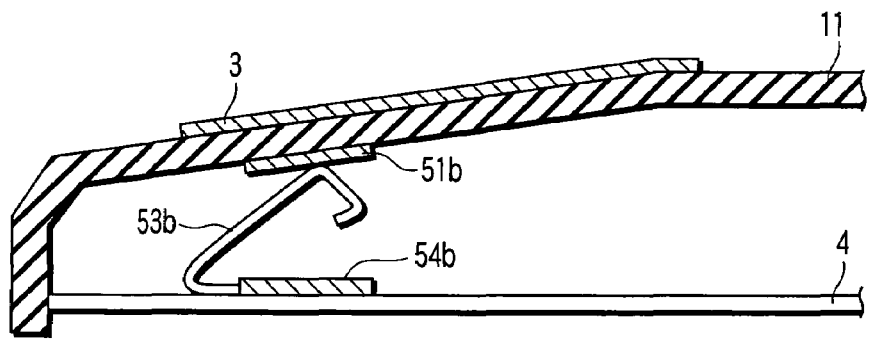
FIG. 13 is a view showing Example 6 of a structure of connection between an antenna element and a circuit board in the cellular phone shown in FIG. 1.

Example 5 further improves FIG. 8. As shown in FIG. 12, an antenna element 3 and a radio power supply pad 51*a* are connected to each other due to capacitive coupling of an outer cover 11. Similarly, Example 6 further improves FIG. 9. As shown in FIG. 13, the antenna element 3 and the radio power supply pad 51*b* are connected to each other by means of capacitive coupling of the outer cover 11.

With such a configuration, there is a need for punching a position of a hole for passing a connection element through the outer cover 11, and a conductive material element can be eliminated. Consequently, a structure of a cellular phone can be simplified and cost reduction can be achieved.

Second Embodiment

Example 1

Figure 14:
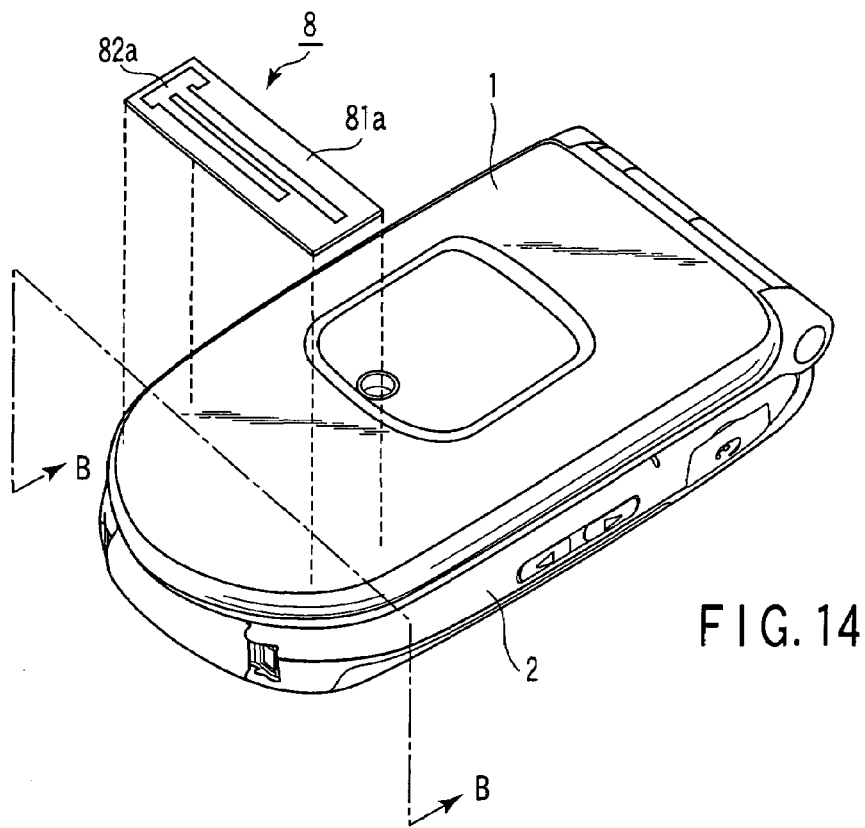
FIG. 14 is a perspective view showing a configuration of a cellular phone which is a second embodiment of a mobile communication terminal according to the present invention.

FIG. 14 is a perspective view showing a configuration of a cellular phone which is a second embodiment of a mobile communication terminal according to the present invention. FIG. 15 is a sectional view taken along the line B-B of an upper casing in FIG. 14 and is a view showing Example 1 of an allocation structure of an antenna element. In the figures, like constituent elements shown in FIGS. 1 and 2 are designated by like reference numerals, and a detailed description will not be described here.

The cellular phone according to the present embodiment fabricates an antenna unit 8 by printing and plating an antenna element 82*a* on a non-metal antenna substrate 81*a* so as to fix the antenna unit 8 onto the upper casing 1 of the cellular phone.

The antenna substrate 81*a* is made of, for example, an acrylonitrile butadiene styrene (ABS) resin or a polyethylene terephthalate (PET) thin film, and has flexibility in order to take along a curved shape of a surface of the casing 1. Further, heat resistance and acid resistance are provided to prepare for a case in which the antenna element 82*a* is processed to be plated. The antenna element 82*a* is made of an electrically conductive material pattern having a thickness of about 10 μm, and is formed on a face of the antenna substrate 81*a* by means of printing and plating. Pad printing, screen printing, offset printing, or the like is used as a printing method.

For example, gold, silver, or copper is used for an electrically conductive paste for forming the antenna element 82*a*. At this time, if a nano-paste is used, a curing temperature is lowered, and good electric conductivity can be obtained. In addition, copper, nickel, and gold may be laminated and plated on a surface of the antenna element 82*a*. By doing this, the electric conductivity of the antenna element 82a can be improved. Further, a catalyst is printed on an outer cover 11 to form a plating layer, so that the antenna element 82a may be printed and formed on the outer cover. Adhesive bonding, heat fixing or the like is used as a method for securely fixing an antenna unit 8 onto a surface of the upper casing 1.

In addition, through-holes are punched at positions which connect with the outer cover 11 of the upper casing 1 and the antenna substrate 81a, respectively. Through-holes and the antenna element 82a and a radio power supply circuit of the printing printed circuit board 4 are electrically connected to each other via a connecting element 5.

As has been described above, the antenna element 82a is printed and formed on the non-metal antenna substrate 81a having heat resistance and acid resistance to fabricate the antenna unit 8, so as to fix this antenna unit 8 onto the upper casing 1 of the cellular phone. Therefore, in a state of the antenna unit 8, plating processing can be carried out with respect to the antenna element 82a. For this reason, there is no need for using a material having heat resistance and acid resistance for the casing 1 of the cellular phone, and concurrently, options for choosing materials for the casing 1 are broadened. In addition, the antenna element 82a is reinforced by the antenna substrate 81a, so that the reliability of the cellular phone can be improved while a structurally stable state is maintained with respect to a compression force from a connecting element 5.

Example 2

In Example 2 of the cellular phone according to the second embodiment of the invention, as shown in FIG. 16, an antenna unit 8 is housed in a casing 1 so as to fix an antenna substrate 81b of the antenna unit on a back face of an outer cover 11 in the upper casing 1. The antenna element 82a and a radio power supply circuit of a printed circuit board 4 are connected to each other by a connecting element 5. With such a configuration, irregularities on a surface of the outer cover 11 using an antenna unit 8 are eliminated, so that the surface of the outer cover 11 can be flatly formed, thereby making it possible to improve a design property. Although there is a need for allocating a space for housing the antenna unit 8 in the casing 1, the antenna unit 8 is made of a thin plate body, and consequently, there is no concern of an increase in the thickness of the casing 1.

Example 3

In Example 3, as shown in FIG. 17, an antenna element 82c is fixed in a state in which the antenna element is abutted against the surface of the outer cover 11 when an antenna unit 8 is fixed onto a surface of an outer cover 11. In addition, an electrically conductive material pattern 51 is printed and formed on a back face of the outer cover 11. Then, a through-hole is provided on the outer cover 11, the antenna element 82 and the electrically conductive material pattern 51 are connected to each other by a first connecting element 52, and the electrically conductive material pattern 52 and a radio power supply circuit of a printed circuit board 4 are connected to each other by a connecting element 53. Further, a resin coat member 10 is formed on the antenna unit 8.

With such a configuration, the antenna element 82c and the electrically conductive material pattern 51 and an electrically conductive material pattern 52 and a radio power supply circuit of the printed circuit board 4 are independently connected to each other. Therefore, a cellular phone can be easily assembled. In addition, the antenna unit 8 is protected by a coat member 10, so that the reliability of the cellular phone can be improved.

Example 4

Figure 18:
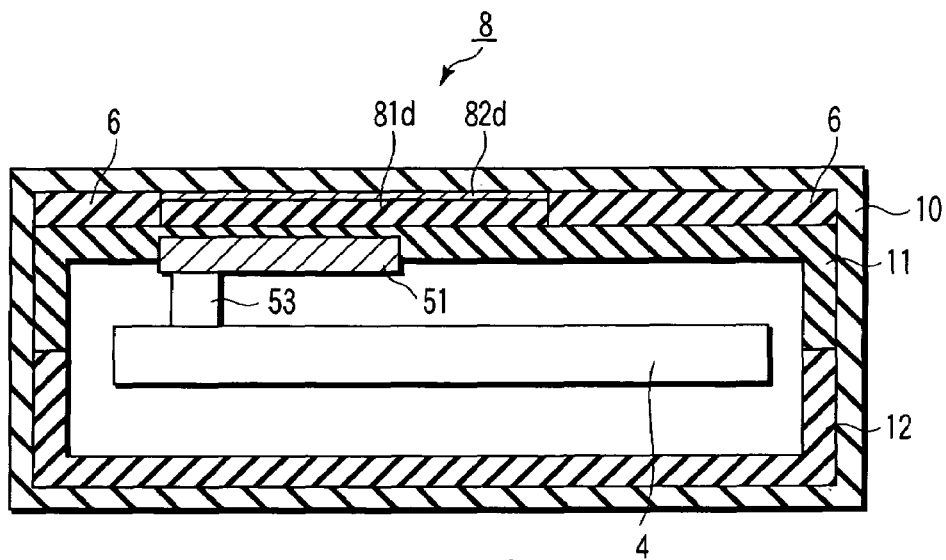
FIG. 18 is a view showing Example 4 of an allocation structure of an antenna element of the cellular phone shown in FIG. 14.

In Example 4, as shown in FIG. 18, a spacer 6 is installed on a surface of an outer cover 11, thereby allocating an installation space for an antenna unit 8 and installing the antenna unit 8 on the allocated installation space. At this time, the antenna unit 8 is fixed in a state in which an antenna substrate 81d abuts against the surface of the outer cover 11. The thickness of the spacer 6 is set to be equal to that of the antenna unit 8, whereby irregularities do not occur on a surface of a casing.

On the other hand, a hollow is formed on a back face of the outer cover 11, and an electrically conductive material pattern 51 is printed and formed on this hollow. At this time, the thickness of the outer cover 11 of the hollow forming site is set such that a total value of the thickness and thickness of an antenna substrate 81d of an antenna unit 8 becomes an optimal value in coupling a capacity between the electrically conductive material pattern 51 and an antenna element 82d.

A hole is punched on the outer cover 11, and the electrically conductive material pattern 52 and a radio power supply circuit of the printed circuit board 4 are connected to each other by a connecting element 53 through-hole. In addition, a coat member 10 is formed of a resin on outer periphery faces of the outer cover 11 and the inner cover 12 including the antenna unit 8 and spacer 6. The coat member 10 protects the antenna unit 8 and casing 1 from external damage.

With such a configuration, an installation position of the antenna unit 8 is specified by the spacer 6. Thus, the antenna unit 8 can be precisely installed without carrying out alignment. In addition, the outer periphery faces of the outer cover 11 and inner cover 12 including the antenna unit 8 and spacer 6 are covered with the coat member 10. As a consequence, the whole casing 1 including the antenna unit 8 can be effectively protected from external damage. Further, an antenna element 82d of the antenna unit 8 and an electrically conductive material pattern 51 are coupled with each other in capacity in accordance with an optimal capacity value. Therefore, power can be reliably supplied to the antenna element 82d. Further, there is no need for providing a hole on the outer cover 11, thus making it possible to maintain processing property and highly maintain the strength of the outer cover 11. Moreover, a hollow is formed on a back face side instead of a surface side of the outer cover 11, thus making it possible to hide irregularities on the surface of the outer cover 11 from the outside.

Example 5

Figure 19:
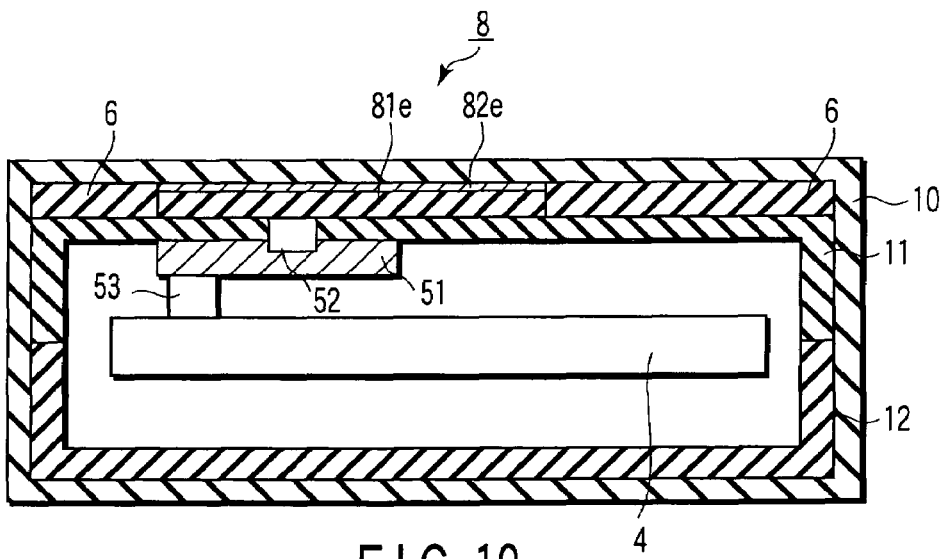
FIG. 19 is a view showing Example 5 of an allocation structure of an antenna element of the cellular phone shown in FIG. 14.

In Example 5, as shown in FIG. 19, a spacer 6 is printed and formed on a surface of an outer cover 11, thereby allocating an installation space for an antenna unit 8 and installing the antenna unit 8 in the allocated installation space. At this time, the thickness of the spacer 6 is set to be equal to that of the antenna unit 8. An electrically conductive material pattern 51 is printed and formed on a back face of the outer cover 11, and further, a hole is punched. Then, an antenna element 82e and the electrically conductive material pattern 51 are connected to each other by a first connecting element 52 via a through-hole of the outer cover 11 and a hole or a cutout (not shown) provided at the antenna substrate 81e. The electrically conductive material pattern 51 and a radio power supply circuit of the printed circuit board 4 are connected to each other by a second connecting element 53. Further, a coat member 10 is formed of a resin on an outer periphery face of each of the outer cover 11 and inner cover 12 including the antenna unit 8.

With such a configuration, as in Example 4 described above, an installation position of the antenna unit 8 is specified by the spacer 6. Thus, the antenna unit 8 can be precisely installed without carrying out alignment. In addition, the outer periphery faces of the outer cover 11 and inner cover 12 including the antenna unit 8 and spacer 6 are covered with a coat member 10, whereby the whole casing 1 including the antenna unit 8 can be effectively protected from external damage. Further, in Example 5, the antenna element 82e and the electrically conductive material pattern 51 are connected to each other by a first connecting element 52. For this reason, there is no need for forming a hollow section for the purpose of electrostatic coupling with the outer cover 11 of the casing, and concurrently, the casing can be easily processed.

Example 6

Figure 20:
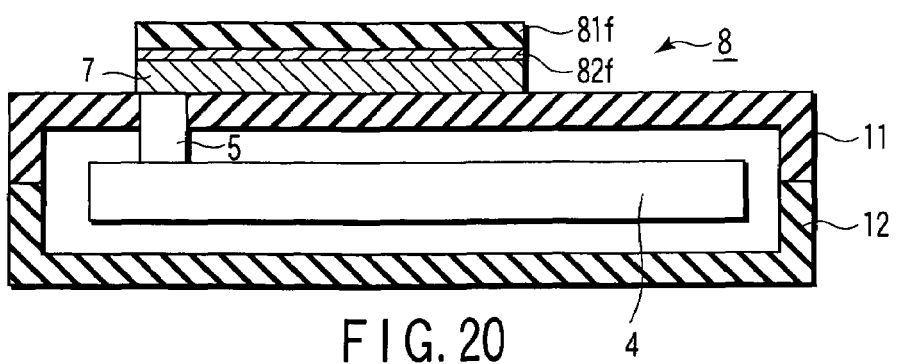
FIG. 20 is a view showing Example 6 of an allocation structure of an antenna element of the cellular phone shown in FIG. 14.

In Example 6, an antenna element 82f is printed and formed on a non-metal antenna substrate 81f, and further, a magnetic member 7 having high permeability is formed on this antenna element 82f by means of printing and plating or the like to fabricate the antenna unit. The antenna unit is fixed onto an upper casing 1 of a cellular phone while the magnetic member 7 is set at its lower side, as shown in FIG. 20. A hole is punched on the outer cover 11 and a hole or a cutout (not shown) is provided at the magnetic member 7, so that the antenna element 82f and printed circuit board 4 are connected to each other by a connecting element 5 through the hole and cutout. The magnetic member 7, as described previously, is made of a material having a nano-granular structure in which magnetic nano-particles are allocated to be dispersed on an insulating matrix substrate in a three-dimensional structure, and the material is molded in a planar shape.

With such a configuration, radiation characteristics are improved, and at the same time, radiation characteristics can be improved due to an advantageous effect of restricting generation of an image current on a metal face of the antenna element 3 and the printed circuit board 4 by means of the magnetic member 7. In addition, the magnetic member 7 has been formed to make it possible to improve the rigidity of the antenna unit.

Example 7

Figure 21:
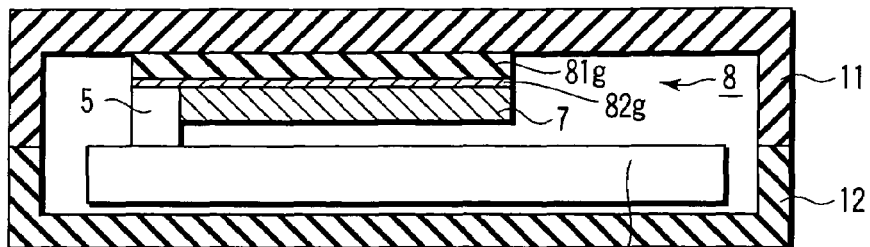
FIG. 21 is a view showing Example 7 of an allocation structure of an antenna element of the cellular phone shown in FIG. 14.

In Example 7, an antenna element 82g is printed and formed on a non-metal antenna substrate 81g, and further, a magnetic member 7 having high permeability is formed on the antenna element 82g by means of printing and plating or the like to fabricate an antenna unit. Then, the antenna unit, as shown in FIG. 21, is fixed onto a back face of an outer cover 11 in a state in which the substrate 81g is brought into contact with the outer cover 11. A cutout is provided at an end of the magnetic member 7, and the antenna element 82g and a printed circuit board 4 are connected to each other by a connecting element 5 through the cutout.

With such a configuration, as in Example 6 described above, radiation characteristics are improved, and at the same time, radiation characteristics can be improved due to an advantageous effect of restricting generation of an image current on a metal face of an antenna element 3 and a printed circuit board 4 by means of the magnetic member 7. Further, the antenna unit is housed in a casing 1, thereby preventing irregularities due to the antenna unit on an outer periphery face of the outer cover 11 from forming, and protecting the antenna unit from damage due to collision or the like.

Example 8

Figure 22:
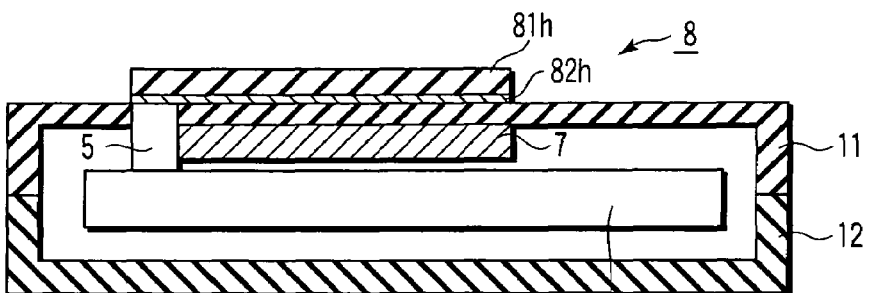
FIG. 22 is a view showing Example 8 of an allocation structure of an antenna element of the cellular phone shown in FIG. 14.

In Example 8, an antenna unit having an antenna element 82h printed and formed on a non-metal antenna substrate 81h is fixed onto an outer periphery face of an outer cover 11, as shown in FIG. 22, with the antenna element 82h on the downside. Further, on a back face of the outer cover 11, a magnetic member 7 is formed in a facing position to a fixing position of the antenna unit with the outer cover 11 sandwiched in between. Then, a hole is punched on the outer cover 11, and a cutout is provided at an end of the magnetic member 7, and further, the antenna element 82h and a printed circuit board 4 are connected to each other by a connecting element 5 through the hole and the cutout.

With such a configuration, radiation characteristics are improved, and at the same time, radiation characteristics can be improved due to an advantageous effect of restricting generation of an image current on a metal face of an antenna element 3 and a printed circuit board 4 by means of the magnetic member 7. In addition, only the magnetic member 7 is formed on a back face of the outer cover 11, and consequently, a protrusion quantity of the antenna unit on an outer periphery face of the outer cover 11 can be reduced.

The following embodiments are considered as specific examples of a connection structure between the antenna unit and printed circuit board 4 shown in FIGS. 14 and 15.

Figure 23:
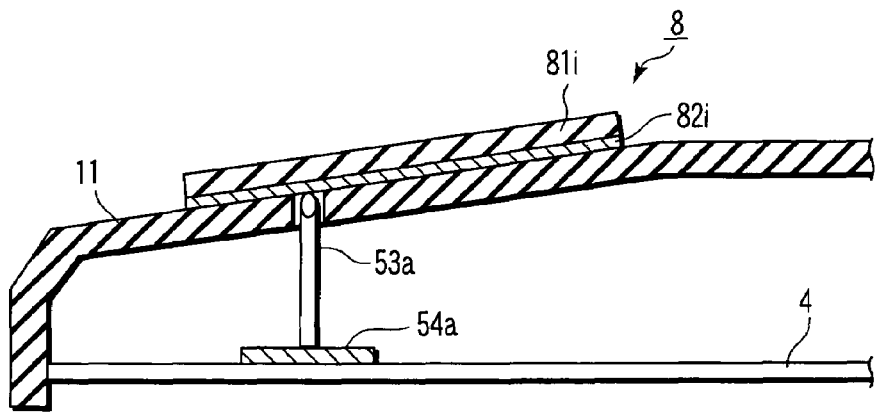
FIG. 23 is a view showing Example 9 of a structure of connection between an antenna element and a circuit board in the cellular phone shown in FIG. 14.

That is, in Example 1, the hole is provided on the outer cover 11 and a radio power supply pad 54a is formed on the printed circuit board 4 so as to embed a spring connector 53a on the radio power supply pad 54a, as shown in FIG. 23. Then, a distal end of the spring connector 53a is pushed into contact with an antenna element 82i of an antenna unit 8 through the hole of the outer cover 11 to electrically connect a radio power supply circuit of the printed circuit board 4 and the antenna element 82i of the antenna unit 8 to each other.

With such a configuration, by using the spring connector 53a as the connecting element 5, an electrical connection between the radio power supply circuit of the printed circuit board 4 and the antenna element 82i of the antenna unit 8 can be achieved without requiring a large installation space.

Figure 24:
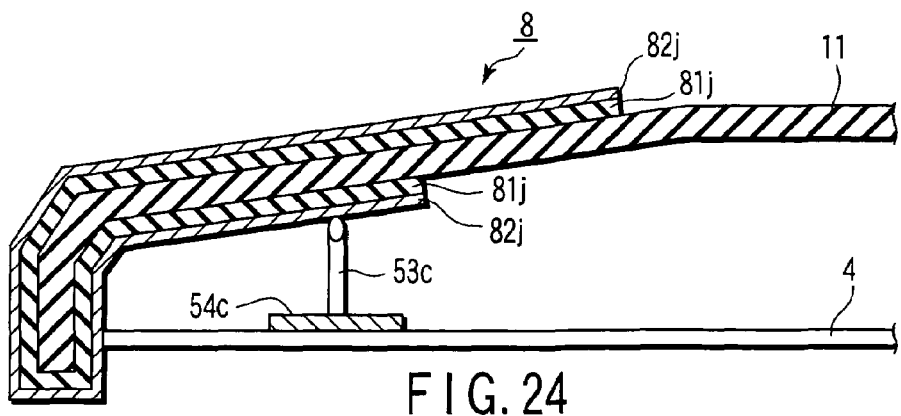
FIG. 24 is a view showing Example 10 of a structure of connection between an antenna element and a circuit board in the cellular phone shown in FIG. 14.

In Example 2, on an antenna substrate 81j, the antenna unit 8 having the antenna element 82j printed and formed thereon is configured in a flexible cable shape. One end portion of this flexible cable shaped antenna unit 8 is securely fixed onto an outer periphery face of the outer cover 11, as shown in FIG. 24. Further, the other end portion of the antenna unit 8 is led into a casing 1 via a gap between the outer cover 11 and a lower cover 12 so as to be securely fixed onto a back face of the outer cover 11. In addition, a radio power supply pad 54a is formed on a printed circuit board 4, and a spring connector 53c is embedded on this radio power supply pad 54c. A distal end of the spring connector 53c is pushed into contact with the antenna element 82j of the antenna unit 8 led into the casing, whereby a radio power supply circuit of the printed circuit board 4 and the antenna element 82j of the antenna unit 8 are electrically connected to each other.

With such a configuration, there is no need for punching a hole on the outer cover 11, thereby making it possible to simplify a structure of the outer cover 11.

Third Embodiment

Figure 25:
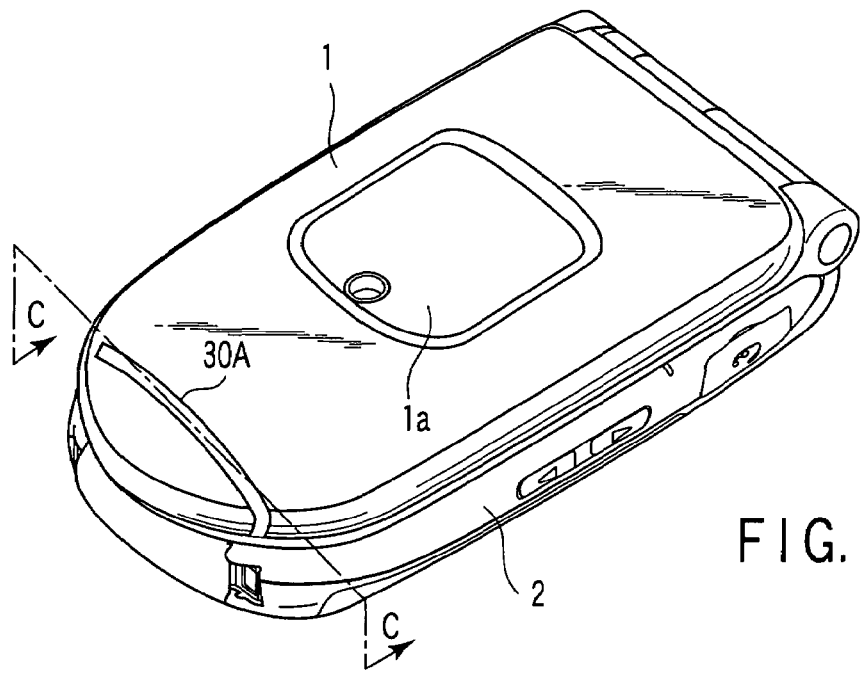
FIG. 25 is a perspective view showing a configuration of a cellular phone which is a third embodiment of a mobile communication terminal according to the present invention.
Figure 26:
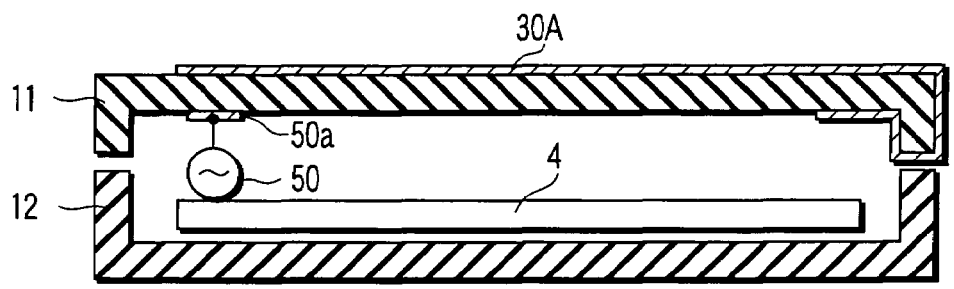
FIG. 26 is a sectional view taken along the line C-C of the cellular phone shown in FIG. 25.

FIG. 25 is a perspective view showing a configuration of a cellular phone according to a third embodiment of the present invention. FIG. 26 is a sectional view taken along the line C-C of an upper casing 1 shown in FIG. 25 and a view showing an allocation structure of an antenna element. In the figures, like constituent elements shown in FIG. 1 and FIG. 2 are designated by like reference numerals, and a detailed description will not be described here.

At a distal end of a surface of an outer cover 11, an antenna element 30A made of an electrically conductive metal pattern which is formed in a linear shape and which has thickness of about 10 μm is formed by means of printing. For example, pad printing, screen printing, offset printing or the like is used as a printing method. For example, gold, silver, or copper is used for an electrically conductive paste for forming the antenna element 30A. At this time, if a nano-paste is used, a curing temperature is lowered, and proper electrical conductivity can be obtained. In addition, copper, nickel, and gold may be plated to be laminated on a surface of the antenna element 30A. By doing this, the electrically conductivity of the antenna element 30A can be improved. For example, a catalyst is printed on the outer cover 11 to form a plating layer, so that the antenna element 30A may be printed and formed on the plating layer.

In the meantime, one end of the antenna element 30A is led into a casing 1 through a gap between the outer cover 11 and an inner cover 12, as shown in FIG. 26, and then, in the casing 1, such one end is printed and formed on a back face of the outer cover 11. A portion led into the casing 1 of the antenna element 30A is used as a tuning section for tuning a resonance frequency or matched impedance of the antenna element 30A. Radio power is supplied from a radio power supply circuit of the printed circuit board 4 to the antenna element 30A, and power is supplied by means of capacity coupling via a radio power supply pad 50a provided on the back face of the outer cover 11.

With such a configuration, as in the first and second embodiments, a distance between the antenna element 30A and the printed circuit board 4 housed in the casing 1 can be spaced to be equal to or greater than at least the thickness of the outer cover 11. As a result, antenna characteristics can be improved as compared with a case of installing the antenna element 30A in the casing 1. One end of the antenna element 30A is led into the casing 1 as it is, and such one end is formed as a tuning section. This makes it possible to freely tune a resonance frequency or matched impedance of the antenna element 30A without changing the sheath state of the casing 1 (without changing a coat state on the surface of the outer cover 11) or the like. Instead of forming the whole antenna element on the back face of the outer cover 11, only one end of the antenna element 30A is led into the outer cover 11 so as to be printed and formed on the back face of the outer cover 11. Thus, an effect of a rib provided on the outer cover 11 can be reduced.

Figure 27:
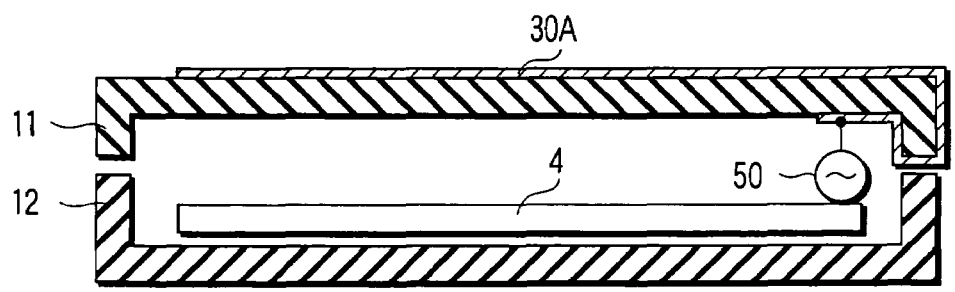
FIG. 27 is a sectional view showing another Example of the cellular phone shown in FIG. 25.

In the foregoing description, a tuning section has been formed by leading one end of the antenna element 30A into the casing 1. However, as shown in FIG. 27, one end of the antenna element 30A is led into the casing 1 to form such one end as a radio power supply section, and power may be supplied to the radio power supply section via a radio power supply line from a radio power supply circuit 50 provided on the printed circuit board 4.

In addition, as an antenna to which the present embodiment can be applied, for example, there can be exemplified an antenna of the monopole type or an antenna of the dipole type, and further, a parasitic element can also be applied.

Fourth Embodiment

Figure 28:
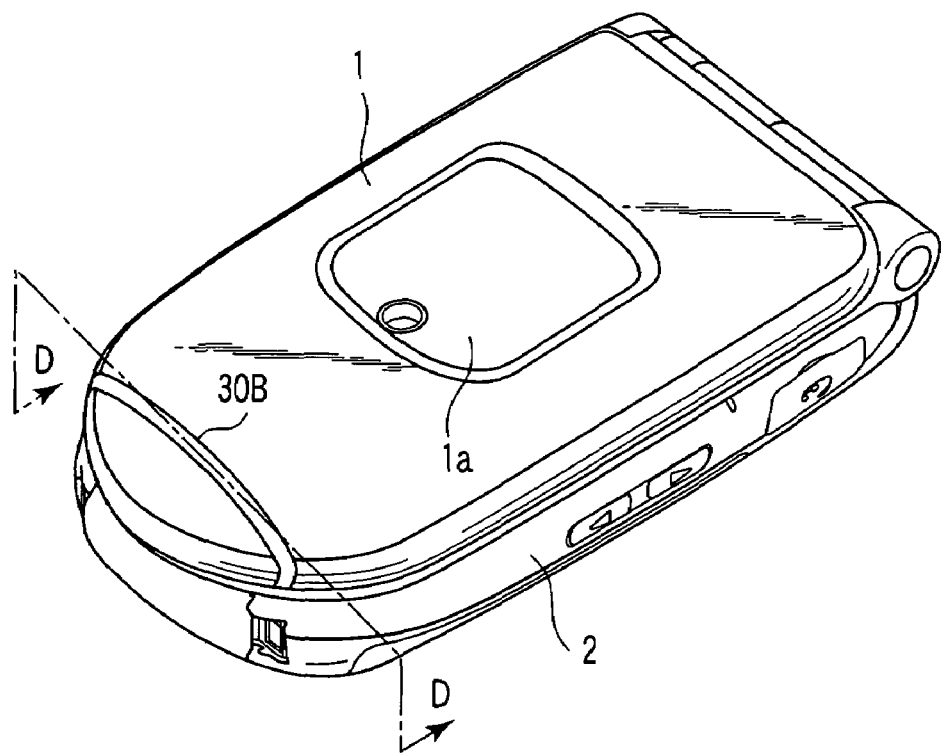
FIG. 28 is a perspective view showing a configuration of a cellular phone which is a fourth embodiment of a mobile communication terminal according to the present embodiment.

FIG. 28 is a perspective view showing a configuration of a cellular phone according to a fourth embodiment of the present invention.

Figure 29:
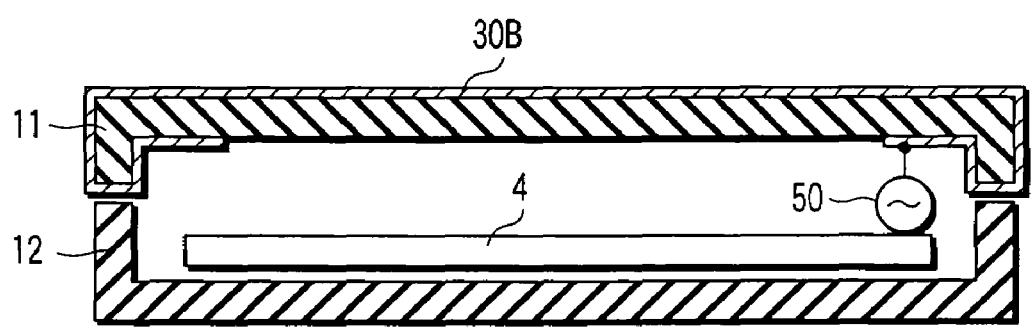
FIG. 29 is a sectional view taken along the line D-D of the cellular phone shown in FIG. 28.

FIG. 29 is a sectional view taken along the line D-D of an upper casing 1 shown in FIG. 28 and is a view showing an allocation structure of an antenna element. In the figures, like constituent elements shown in FIG. 1 and FIG. 2 are designated by like reference numerals, and a detailed description will not be given here.

An antenna element 30B made of an electrically conductive material pattern which is formed in a linear shape and which has a thickness of about 10 μm is printed and formed at a distal end of a surface of an outer cover 11. Both ends of the antenna element 30B, respectively, as shown in FIG. 29, are led into a casing 1 through a gap between the outer cover 11 and an inner cover 12, and the both ends are printed and formed on a back face of the outer cover 11 in a casing 1. One end led into the casing 1 of the antenna element 30B is used as a tuning section for tuning a resonance frequency or matched impedance of the antenna element 30B. On the other hand, the other end led into the casing 1 of the antenna element 30B is used as a radio power supply section, and power is directly supplied to this radio power supply section from a radio power supply circuit 50 provided on a printed circuit board 4.

With such a configuration, as in the third embodiment, a distance between the antenna element 30B and the printed circuit board 4 housed in the upper casing 1 can be spaced to be equal to or greater than at least the thickness of the outer cover 11. Thus, antenna characteristics can be improved as compared with a case of installing the antenna element 30B in the casing 1. Further, one end of the antenna element 30B is led into the casing 1 as it is, and the one end is formed as a tuning section. As a consequence, the resonance frequency of matched impedance of the antenna element 30B can be freely tuned in the casing 1 without changing the outer coating of the casing 1 (changing the coat state on the surface of the outer cover 11) or the like.

Furthermore, the other end of the antenna element 30B is led into the casing 1, and is formed as a radio power supply section. Consequently, the power can be efficiently supplied to the antenna element 30B with a simple configuration. Instead of forming the whole antenna element on a back face of the outer cover 11, only both ends of the antenna element 30B are led into the casing 1 so as to be printed and formed on the back face of the outer cover 11. For this reason, an effect of a rim provided on the outer cover 11 can be reduced.

A distal end of the antenna element 30B may be led into the casing 1. With such a configuration, a user's finger is hardly brought into contact with a distal end of an antenna element whose radiation electric field strength becomes maximal. This makes it possible to maintain a high radiation efficiency of an antenna.

Fifth Embodiment

Figure 30:
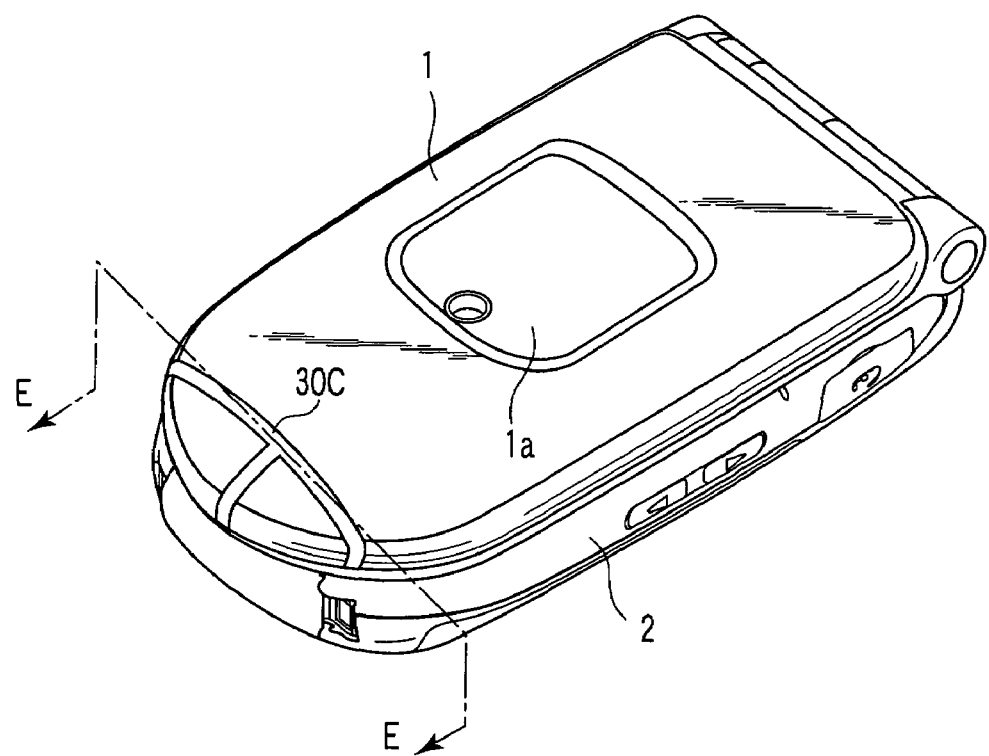
FIG. 30 is a perspective view showing a configuration of a cellular phone which is a fifth embodiment of a mobile communication terminal according to the present invention.
Figure 31:
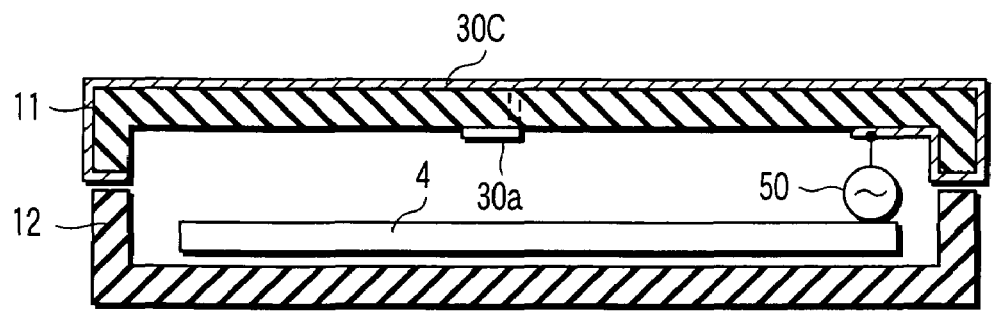
FIG. 31 is a sectional view taken along the line E-E of the cellular phone shown in FIG. 30.

FIG. 30 is a perspective view showing a configuration of a cellular phone according to a fifth embodiment of the present invention. FIG. 31 is a sectional view taken along the line E-E of an upper casing 1 shown in FIG. 30 and is a view showing an allocation structure of an antenna element. In the figures, like constituent elements shown in FIG. 1 and FIG. 2 are designated by like reference numerals, and a detailed description will not be given here.

An antenna element 30C made of an electrically conductive material pattern which is formed in a linear shape and which has thickness of about 10 μm is printed and formed at a distal end of a surface of an outer cover 11. Both ends of the antenna element 30C are led into a casing 1 through a gap between the outer cover 11 and an inner cover 12, as shown in FIG. 29, respectively, and the both ends are printed and formed on a back face of the outer cover 11 in the casing 1. One end led into the casing 1 of the antenna element 30C is used as a tuning section for tuning a resonance frequency or matched impedance of the antenna element 30C. On the other hand, the other end led into the casing 1 of the antenna element 30C is used as a radio power supply section, and the power is directly supplied to the radio power supply section via a radio power supply line from a radio power supply circuit 50 provided on a printed circuit board 4.

The antenna element 30C has a stab 30a. The stab 30a is also made of an electrically conductive metal pattern which is formed in a linear shape and which has thickness of about 10 μm, as in a main body of the antenna element 30C. As shown in FIG. 31, the stab is led into the casing 1 through a gap between the outer cover 11 and the inner cover 12 as shown in FIG. 31, and then, is printed and formed on a back face of the outer cover 11 in the casing 1. The stab 30a is used for impedance tuning.

With such a configuration, the stab 30a is led into the casing 1 so as to carry out impedance tuning. Thus, impedance tuning can be carried out comparatively freely in the casing 1 without changing the sheath state of the casing 1 (or without changing the coat state on the surface of the outer cover 11).

Sixth Embodiment

FIG. 32 is a sectional view showing a configuration of essential portions of a cellular phone according to a sixth embodiment of the present invention. An antenna element 30D is printed and formed at a distal end of a surface of an outer cover 11 of a casing 1 as in FIG. 32 described previously. Then, both ends of the element are led into the casing 1 through a gap between the outer cover 11 and an inner cover 12, respectively, and are printed and formed on a back face of the outer cover 11. One end of the antenna element 30D led into the casing 1 is formed as a distal end. On the other hand, the other end connects to the ground pattern of a printed circuit board 4 as a tuning section. The tuning section is used for impedance tuning.

Further, a radio power supply pattern 30b is printed and formed at a distal end of a surface of the outer cover 11 of the casing 1. A distal end of the radio power supply pattern 30b is connected to a center of the antenna element 30D. On the other hand, a proximal end of the radio power supply pattern 30b is led into the casing 1 through a gap between the outer cover 11 and the inner cover 12, and is connected to a radio power supply circuit 50 provided on the printed circuit board 4.

As described above, in the sixth embodiment, the other end of the antenna element 30D is led into the casing 1 so as to carry out impedance tuning. For this reason, impedance tuning can be carried out comparatively freely in the casing 1 without changing the sheath state of the casing 1 (without changing the coat state on the surface of the outer cover 11). In addition, a distal end of the antenna element 30D is led into the casing 1. Thus, a user's finger or the like is hardly brought into contact with the distal end of the antenna element on which the radiation electric field strength becomes maximal. This makes it possible to maintain a high radiation efficiency of an antenna. Moreover, with respect to a radio power supply pattern 30b as well, the pattern is led into the casing 1 so as to be connected to a radio power supply circuit 50. As a consequence, power can be efficiently supplied to the antenna element 30D with a simple configuration.

A short-circuit section of the antenna element 30D which is led into the casing 1 and which is grounded on a grounding pattern of the printed circuit board 4 can include: a short-circuit section of an inverse F antenna; a short-circuit section of a folded antenna; a short-circuit section of a transmission antenna; a short-circuit section of a patch antenna; and a short-circuit section of a parasitic element or the like. In this case, a distance between the radio power supply circuit 50 and each of the short-circuit sections are properly differentiated from each other depending on each of the above antenna types.

Other Embodiments

FIG. 33 is a partial cross sectional view showing a configuration of essential portions of a cellular phone according to other embodiments of the present invention. In the cellular phone of the present embodiment, first and second antenna elements 31 and 32 are printed and formed on a surface and a back face of an outer cover 11, respectively. A through hole 33 is provided on the outer cover 11 so as to make connection between the first and second antenna elements 31 and 32 via the through-hole 33. With such a configuration, there is no need for routing a connecting element for making connection between the antenna elements 31 and 32 through a gap provided at an end rim of a casing or through a hole for housing an LDC or a battery pack, thereby making it possible to simply configure a folded antenna.

FIG. 34 is a view showing an example of further improving an installation structure of the antenna element shown in FIG. 12. In this example, a recessed portion having a depth equal to the thickness of an antenna element 3 is formed on a surface of an upper casing 11, and an antenna element 3 is printed and formed at the recessed portion. Then, a radio power supply pad 51a is formed on a back face of the outer cover 11 and a spring connector 53a is embedded on a wiring pattern 54a of a printed circuit board 4 so as to push a distal end of the spring connector 53a into contact with the radio power supply pad 51a. The antenna element 3 and the radio power supply pad 51a are coupled with each other in capacity.

With such a configuration, the antenna element 3 does not protrude from a surface of the outer cover 11, thereby making it possible to flatten a casing face.

Figure 35:
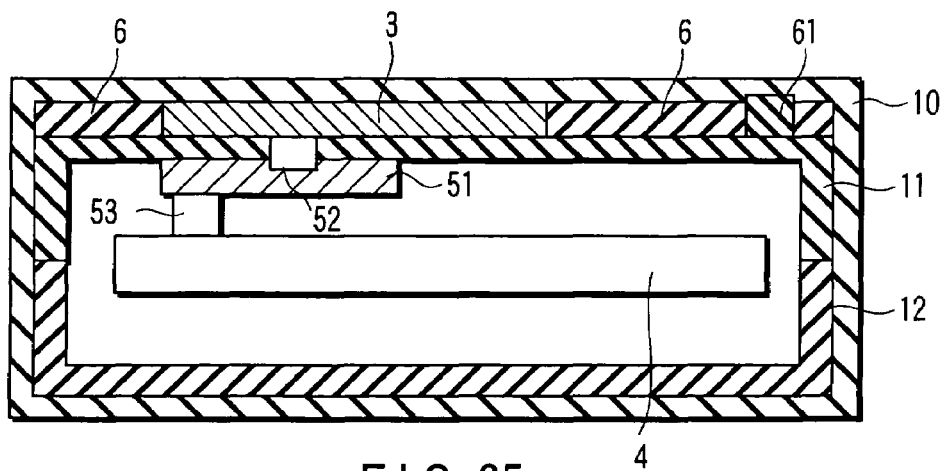
FIG. 35 is a view showing a further improved example of an allocation structure of the antenna element shown in FIG. 19.

FIG. 35 is a view showing an example of further improving an allocation structure of the antenna element shown in FIG. 19. In this example, at least one reserved spacer 61 has been provided so as to print and form a spacer 6 on the surface of the outer cover 11. By doing this, the spacer 6 can be printed and formed precisely and easily.

Figure 36:
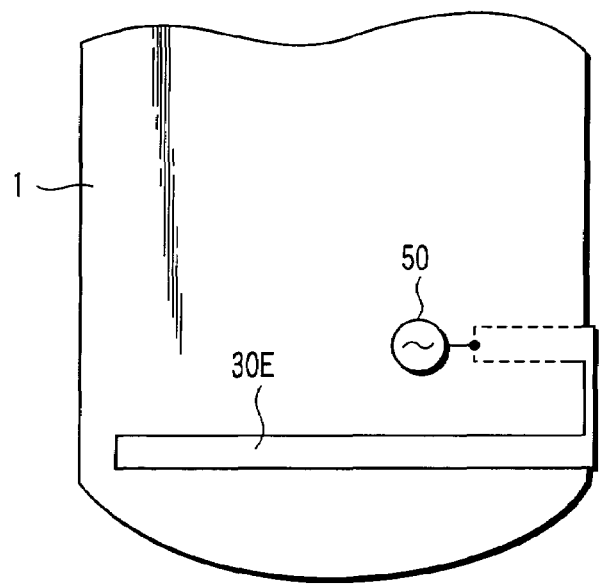
FIG. 36 is a sectional view for explaining another embodiment of a cellular phone according to the present invention.

In the third to fifth embodiments, when one end or both ends of an antenna element, or alternatively, a stab or a radio power supply pattern is led into the casing 1 and is printed and formed on a back face of the outer cover 11, a position of a pattern formed on the back face of the outer cover 11 and a position of a pattern formed on the surface of the outer pattern 31 may be mutually displaced while the outer cover 11 is sandwiched such that at least a part does not overlap, as shown in, for example, FIG. 36. By doing this, an overlap area between the pattern formed on the back face of the outer cover 11 and the pattern formed on the surface of the outer cover 11 can be reduced. In this rule, coupling between patterns of the antenna element is reduced to make it possible to restrict degradation of characteristics.

Figure 37:
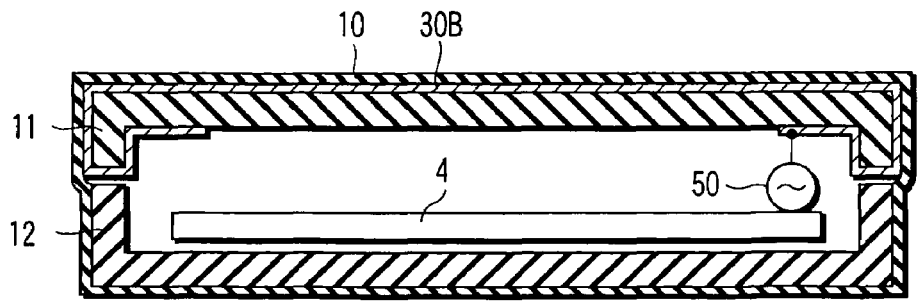
FIG. 37 is a sectional view for explaining still another embodiment of a cellular phone according to the present invention.

Further, the foregoing third to fifth embodiments each have described an example of merely printing and forming an antenna element or the like on the surface of the outer cover 11 of the casing 1. However, as shown in, for example, FIG. 37, the surface of the outer cover 11 on which an antenna element 30B or the like has been formed may be coated with a coat member 10 by means of a resin coat or the like. By doing this, the printed and formed antenna element 30A or the like is protected from external damage or corrosion, thereby making it possible to improve terminal reliability.

Furthermore, in the case where a metal pattern such as an antenna element 30A is led into a casing 1 in the third to fifth embodiments, the metal pattern is led through a gap between the outer cover 11 and the inner cover 12. However, without being limited thereto, it is possible to utilize: a screw hole for helically mounting a screw for coupling the outer cover 11 and the inner cover with each other; a gap between a liquid crystal display 1a and a casing 1; a hole portion of a card slot provided to mount a memory card or the like; a speaker sound discharge hole; a hole portion of a housing section provided to house a battery pack; a earphone jack hole section; a gap between a key button and the casing 1; a heat radiation hole for heat resistance; and a battery contact point hole portion or the like.

At that time, for a lead-in position of an antenna element, a flat section or a recessed portion may be utilized to the maximum while avoiding corners or protrusions of the casing 1. By doing so, an antenna element or the like can be protected from damage due to collision or the like. Further, at a position spaced from a site proximal to gravity such as a site of housing a battery pack, a metal pattern such as an antenna element 30A may be led into the casing 1. In the case where a terminal has dropped at a site proximal to gravity of the casing, there is a high possibility that collision occurs with a floor or the like. Therefore, as described above, at a position spaced from a site proximal to gravity of a terminal, an antenna element or the like is led into a casing. This makes it possible to improve a probability of avoiding an antenna element or the like from damage. In addition, a hole portion is provided in a recessed portion for mounting a strap so as to lead the antenna element or the like into a casing through this hole portion.

With respect to a type of a mobile communication terminal and a configuration thereof; a type of antenna and a configuration thereof; a position of forming an antenna element; a configuration of means for making connection between an antenna element and a radio power supply circuit; and a method for printing an antenna element as well, various modifications can be made without deviating from the spirit of the present invention.

In short, the present invention is not limited to the foregoing embodiments as they are. At a stage of carrying out the invention, the present invention can be embodied by modifying constituent elements without deviating from the spirit of the invention. In addition, a variety of inventions can be formed by using a proper combination of a plurality of constituent elements disclosed in the foregoing embodiments. For example, some constituent elements may be eliminated from all of the constituent elements disclosed in the embodiments. Further, constituent elements according to the different embodiments may be properly combined with each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mobile communication terminal, comprising:
  a casing made of an electrically nonconductive material, the casing having housed therein a circuit board on which a radio power supply circuit and a ground plane have been formed;
  an antenna element made of an electrically conductive material pattern, the antenna element being printed on a face of the casing; and
  a connecting element which electrically connects the antenna element and the circuit board;
  wherein the connecting element comprises:
    a radio power supply pad allocated between the antenna element and the circuit board;
    a first connecting element which makes a connection between the antenna element and the radio power supply pad; and
    a second connecting element which makes a connection between the radio power supply pad and the circuit board.

2. The mobile communication terminal according to claim 1, further comprising:
  a magnetic member interposed between the antenna element and the circuit board, wherein the magnetic member comprises magnetic nano-particles having a magnetic property dispersed on an insulating matrix substrate.

3. The mobile communication terminal according to claim 1, further comprising:
  a coat member made of an electrically nonconductive material, the coat member being coated at least on the antenna element.

4. The mobile communication terminal according to claim 1, further comprising:
  a spacer installed on the casing at a site at which the antenna element is not installed, the spacer having a height equivalent to a thickness of the antenna element.

5. The mobile communication terminal according to claim 1, wherein:
  the casing comprises a hollow having a depth which is equivalent to a thickness of the antenna element, and
  the antenna element is formed or installed on a bottom face of the hollow.

6. The mobile communication terminal according to claim 1, wherein the antenna element further comprises a stab made of an electrically conductive material pattern, the stab being led into the casing via a gap formed in the casing from outside the casing.

7. The mobile communication terminal according to claim 1, wherein the first connecting element electrically connects the antenna element and the radio power supply pad via a through-hole penetrating through the casing.

8. The mobile communication terminal according to claim 1, wherein the first connecting element comprises a signal line or a conductive material pattern wired from a surface side to a back face side of the casing via a rim part of the casing, and electrically connects the antenna element and the radio power supply pad by the signal line or conductive material pattern.

9. The mobile communication terminal according to claim 1, wherein the first connecting element comprises a capacitive coupling section provided between the antenna element and the radio power supply pad, and the capacitive coupling section is configured by setting a thickness of a site sandwiched between the antenna element and the radio power supply pad at a predetermined value.

10. The mobile communication terminal according to claim 1, wherein the second connecting element comprises a spring connector arranged between the radio power supply pad and the circuit board.

11. A mobile communication terminal, comprising:
a casing made of an electrically nonconductive material, the casing having housed therein a circuit board on which a radio power supply circuit and a ground plane have been formed;
an antenna unit installed on a face of the casing, the antenna unit comprising an antenna substrate made of an electrically nonconductive material and an antenna element made of an electrically conductive material pattern printed on a face of the antenna substrate; and
a connecting element which makes an electrical connection between the antenna element of the antenna unit and the circuit board;
wherein the connecting element comprises:
a radio power supply pad allocated between the antenna unit and the circuit board;
a first connecting portion which makes an electrical connection between the antenna element of the antenna unit and the radio power supply pad; and
a second connecting element which makes an electrical connection between the radio power supply pad and the circuit board.

12. The mobile communication terminal according to claim 11, further comprising:
a magnetic member interposed between the antenna element and the circuit board, wherein the magnetic member comprises magnetic nano-particles having a magnetic property dispersed on an insulating matrix substrate.

13. The mobile communication terminal according to claim 11, further comprising:
a coat member made of an electrically nonconductive material, the coat member being coated at least on the antenna element.

14. The mobile communication terminal according to claim 11, further comprising:
a spacer installed on the casing at a site at which the antenna unit is not installed, the spacer having a height that is equivalent to a thickness of the antenna unit.

15. The mobile communication terminal according to claim 11, wherein:
the casing comprises a hollow having a depth which is equivalent to a thickness of the antenna element, and
the antenna element is formed or installed on a bottom face of the hollow.

* * * * *